United States Patent [19]

Ogawa et al.

[11] Patent Number: 4,996,075

[45] Date of Patent: Feb. 26, 1991

[54] METHOD FOR PRODUCING ULTRATHIN METAL FILM AND ULTRATHIN-THIN METAL PATTERN

[75] Inventors: Kazufumi Ogawa, Hirakata; Hideharu Tamura, Katano; Norihisa Mino, Settsu, all of Japan

[73] Assignee: Matsushita Electric Industrial Co., Ltd., Osaka, Japan

[21] Appl. No.: 287,090

[22] Filed: Dec. 21, 1988

[30] Foreign Application Priority Data

Dec. 21, 1987 [JP] Japan .................. 62-323103
Sep. 28, 1988 [JP] Japan .................. 62-243008

[51] Int. Cl.$^5$ ............................................. B05D 3/06
[52] U.S. Cl. .................................. 427/12; 427/35;
427/36; 427/38; 427/43.1; 427/53.1; 427/261;
427/299; 427/333; 427/343; 427/344; 427/404;
427/430.1
[58] Field of Search ............... 427/36, 35, 54.1, 53.1,
427/430.1, 404, 261, 333, 12, 38, 43.1, 299, 343,
344

[56] References Cited

U.S. PATENT DOCUMENTS 4,539,061  9/1985  Sagiv .................................. 427/35

OTHER PUBLICATIONS

"IEE Proceedings" Section A a I, vol. 130, Part 1, No. 5, pp. 252-255 (1983).

*Primary Examiner*—Bernard Pianalto
*Attorney, Agent, or Firm*—Wenderoth, Lind & Ponack

[57] ABSTRACT

A responsive film containing a responsible group occuring a chemical reaction by energy beam is formed on an insulated substrate, and energy beam is irradiated in a pattern, and part of the responsive group is selectively deactivated or activated, and only the remaining portion of the responsive group of the responsive film is coupled with a chemical substance containing metal in a later process, and an ultrafine pattern of metal film is formed.

15 Claims, 4 Drawing Sheets

METHOD FOR PRODUCING ULTRATHIN METAL FILM AND ULTRATHIN-THIN METAL PATTERN

BACKGROUND OF THE INVENTION

This invention relates to a metal pattern forming method capable of forming a ultrathin metal film selectively on an substrate by utilizing a chemical reaction, which may be applied in fabrication of semiconductor device or thin film of conductive material or the like.

Hitherto, the method of preparing a wire pattern in production of semiconductor devices generally involved coating a photosensitive resin film (photoresist) which is decomposed or polymerized by irradiation with light on a substrate having a metal film deposited by evaporation or other method, exposing light in a pattern, developing, forming a resist pattern, and then etching the metal film. In such metal pattern, however, more fine pattern fabrication is being demanded today to increase integration density of the semiconductor devices or the quality of printing.

Especially, for fabrication of VLSI, it is required to produce sub-micron metal patterns with high precision. In such case, although it may greatly depend on the characteristics of the resist resin, it is necessary to coat the resist film as thinly as possible generally to increase resolution, that is, in order to raise the resolution. On the other hand, in the sub-micron pattern fabrication, the wet etching method cannot be applied, and it is necessary to employ dry etching, such as ion etching, plasma etching, and sputter etching, but in order to enhance the resistance of the resist pattern to dry etching, it was generally necessary to fabricate the thick resist film, although the dry etching resistance is dependent on the resist material.

Therefore, to satisfy the above two contradictory requirements, it is desired that any photoresist material be excellent in resolution if the coated film is thick, or excellent in dry etching resistance if the coated film is thin, but such material is thus unknown.

SUMMARY OF THE INVENTION

It is hence primary object of this invention to present a method for producing ultrathin metal film excellent in high resolution, uniformity and conductivity, and a method of forming said metal patterns.

According to this invention, a responsive film containing a responsive group such as an acetylene group or diacetylene group which undergoes a chemical reaction by exposure to an energy beam (electron beam, ion beam, light, X-ray, etc.) is formed on an insulated substrate. Then the film is exposed pattern wise to the energy beam to selectively deactivate or activate the responsive group in the film, and only the remaining portion of the responsive group in the responsive thin film is bonded with a chemical substance containing metal such as Cu and Ag (metal compound) in a later stop. Thereby, a metal film is formed in an ultrafine pattern. More preferably, as the chemical substance, a reagent having a group reacting with the responsive group or a denatured group formed from the responsive group is present at one end, and a responsive group similar to the said responsive group present at the other end is used, and an ultrathin metal film pattern is formed by a step of bonding with the said chemical substance selectively, and a step of bonding with the chemical substance containing a metal. Furthermore, as the means for forming the responsive film, the Langmuir-Blodgett technique or the chemical absorption process may be employed, and by depositing the monomolecular films so that the energy beam responsive groups may be arranged on the substrate surface, the ultrafine metal pattern may be formed while the sensitivity is enhanced.

In this invention, by preliminarily forming, for example, an aldehyde group (-CHO) on the surface of a monomolecular film or a built-up film, a molecular or atomic metal film can be deposited and formed on the monomolecular film from a water-soluble metal compound, with the reducing action of this aldehyde group being utilized. Therefore, according to this invention, it is possible to form ultrafine metal patterns easily.

DETAILED DESCRIPTION OF THE INVENTION

EMBODIMENT 1

The first method of the invention is explained with FIGS. 1 and 2 as follows.

For example, in this embodiment, on a semiconductor Si substrate 1 on which SiO$_2$ is formed, a monomolecular film 2 of

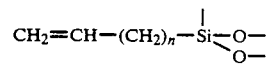

is formed by a chemical adsorption method on the surface of the substrate 1, using a silane surface active agent, for example, CH$_2$=CH—(CH$_2$)$_n$—SiCl$_3$ (where n is an integer, preferably 10 to 20). An

Figure 1A:
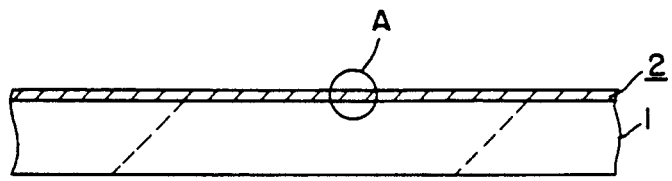
FIG. 1 shows process sectional views of a first embodiment for explaining the method of the invention, in which a, c, e are the sectional view of substrate to conceptually explain the process, and b, d, g, g, h are magnified views of a a, c, e at the molecular level in the circle-marked parts A to C.
Figure 1B:
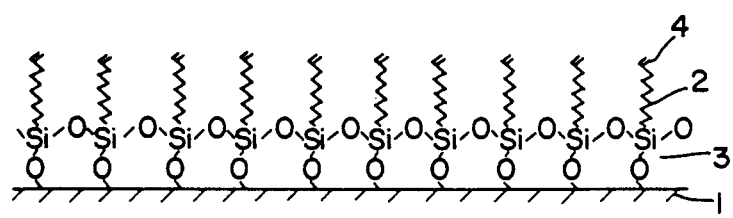
Figure 1C:
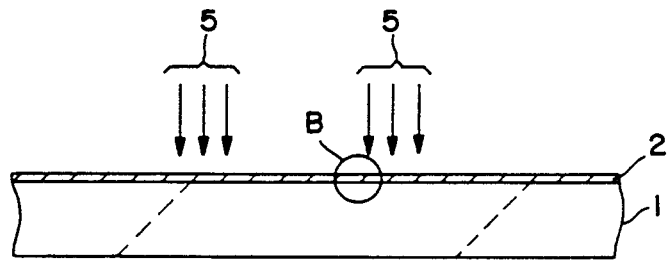
Figure 1D:
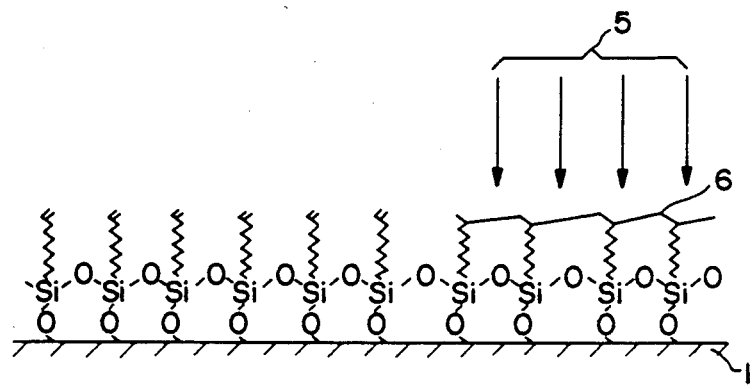
Figure 1E:
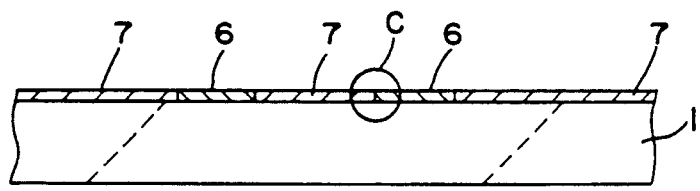
Figure 1F:
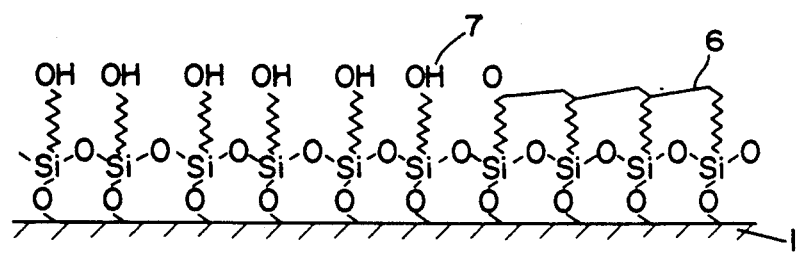
Figure 1G:
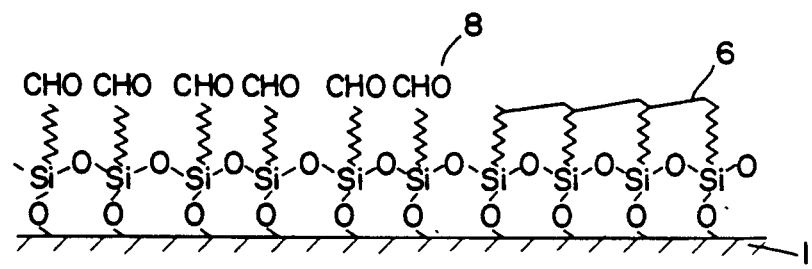

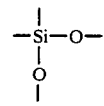

bond is formed on the surface of SiO$_2$ by dipping in a solution of, for example, 80% of n-hexane, 12% of carbon tetrachloride and 8% of chloroform dissolved at a concentration of 2.0×10$^{-1}$ to 5.0×10$^{-2}$ mol/liter (FIG. 1a). Here, the vinyl group 4 of the silane surface active agent is arranged on the surface of the substrate (FIG. 1b), and a polymerization reaction can be caused between vinyl groups by electron beam irradiation, and then the electron beam 5 is exposed in a pattern as shown in FIG. 1c. As a result, as shown in FIG. 1d, the double bonds of the vinyl groups of the portion 6 irradiated with electron beams are mutually bonded, and selectively deactivated.

Furthermore, at room temperature, by dipping in a TMF solution of diborane 1 mol/liter, and further immersing in an aqueous solution of NaOH 0.1 mol/liter and 30% $H_2O_2$, hydroxyl group 7 is added to the vinyl group of the unirradiated portion (FIG. 1 e, f,).

Figure 1H:
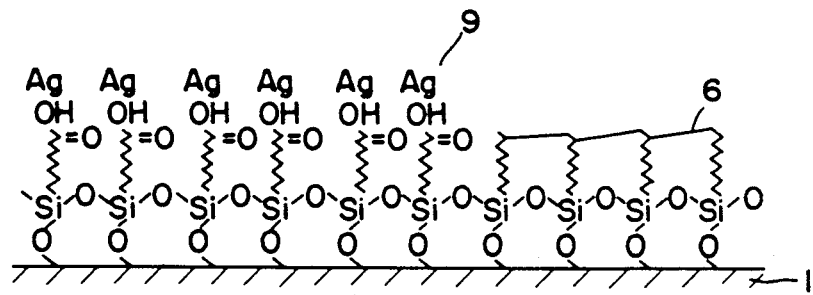

Afterwards, using the aldehyde forming reaction of an alcohol the terminal hydroxyl group 7 is converted into an aldehyde group (—CHO) 8 (FIG. 1g), and it is dipped in an aqueous solution of a compound containing metal, for example, silver nitrate ($AgNO_3$). In consequence, $AgNO_3$ is reduced by the aldehyde group on the surface of the monomolecular film 2, and the Ag 9 is selectively deposited and formed on the monomolecular film in a pattern (FIG. 1h).

That is, in the process, an atomic or molecular metal thin film is selectively formed in a submicron or even finer pattern on a monomolecular responsive film. Therefore, according to the method of this embodiment, an ultrafine wire can be formed, which is very effective for fabrication of electronic devices such as a semiconductor device. Also, if it is desired to form the metal film on the entire surface of the substrate, the electron beam irradiation step may be skipped as may evidently be seen from the description herein.

Furthermore, at this time, if the metal is a substance capable of easily forming a natural oxide film such as Ag, the surface of Ag will be spontaneously covered with a natural oxide film. Therefore, when $CH_2=CH_2—(CH_2)_n—SiCl_3$ is further caused to react with the hydroxyl group on the silver surface in the same reaction as above, a bonding of

Figure 2A:
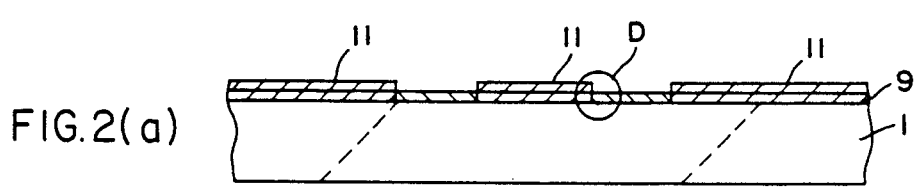
FIG. 2a is a process sectional view in a second embodiment of the invention, and b is a magnified view of part D.
Figure 2B:
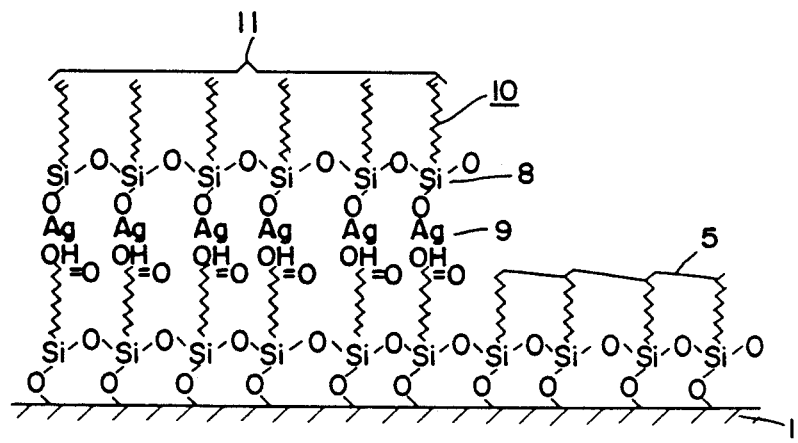

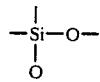

is formed (FIG. 2a, b). That is, at this step, the molecule 10 of

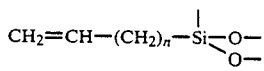

is selectively bonded in monolayer, and a thin film pattern 11 is formed.

Thereafter, by similarly repeating a step of adding hydroxyl groups to the vinyl groups of the silane surface active agent formed in a pattern on the surface, a step of converting into aldehyde group, a step of depositing metal, and a step of adding the silane surface active agent, a ultrafine metal pattern having a required conductivity can be formed.

Accordingly, by the method of this embodiment, a molecular structure alternately laminating the organic monomolecular film and molecular or atomic metal layer can be formed, and it is extremely advantageous for application into superelectronic device such as molecular device.

In the above example, meanwhile, a substrate producing —Si—O bonding by reacting with —SiCl$_3$ of silane surface active agent, that is, an Si substrate on which $SiO_2$ is formed is employed, but it is also possible to use others, for example, inorganic materials such as $Al_2O_3$ and glass, and organic materials such as polyvinyl alcohol. When the substrate surface is covered with a material having a hydrophobic property, it is possible to arrange hydrophilic groups on the entire surface of the substrate by using the Langmuir-Blodgett method, or it is also possible to change the substrate surface hydrophilic by $O_2$ plasma treatment or the like. Although the adhesion is inferior in Langmuir-Blodgett film, if the substrate surface material is hydrophobic, it is possible to make the entire surface hydrophilic by stopping the build-up when the hydrophobic face is formed up to the substrate side.

In the event of $O_2$ plasma treatment, the substrate surface is oxidized, and it becomes hydrophilic.

In the foregoing embodiment, the film of silicon surface active agent is prepared by adsorption reaction as a responsive thin film, but by using a reagent having the —Cl group preliminarily replaced by the —OH group ($CH_2=CH—(CH_2)_n—Si(OH)_3$, etc.), a responsive thin film may be also formed by Langmuir-Blodgett technique.

The method of the invention may be also applied as a molecular device manufacturing technique by using a reagent containing groups for forming a π conjugate polymer or functional molecule such as —C≡C—C≡C—, —C$_6$H$_4$—, —C$_4$NH$_3$—, —C$_4$SH$_2$—, —C$_6$H$_4$—CH=CH— —C$_6$H$_4$—S—, —C$_6$H$_4$—O—, between $CH_2$ bondings of the straight chain or as side chain in the silane surface active agent presented in the above embodiment.

Thus, according to the method of the invention, since the energy beam responsive thin film, on which pattern is formed, is a single or several layers thick monomolecular film, it is possible to form ultrafine metal patterns. Furthermore, by performing the selective film growth reaction by the reaction between —SiCl$_3$ and —OH group, and between the —CHO group and Ag ion, a highly conductive pattern can be obtained. Therefore, the method of this invention brings a great benefit in preparing ultrafine wiring pattern, especially in manufacturing wire in VLSI production.

Since the Langmuir-Blodgett technique or adsorption reaction technique used in preparation of the responsive film utilizes interface reaction on the substrate surface, the process is less affected by steps on the substrate and it is very useful on a substrate having many steps such as VLSI devices.

This embodiment relates to an example of interface reaction between —SiCl$_3$ and —OH, and between Ag ion and —CHO, but this is not limitative as far as the process uses a similar reaction mechanism. The method of the invention is hence particularly effective for formation of ultrafine wiring patterns, especially, for improvement in the wiring process in VLSI production.

Embodiment 2

The second method of the invention is explained below by reference to FIG. 3.

For example, in this embodiment, on a semiconductor Si substrate 21 on which $SiO_2$ is formed, a monomolecular film 22 of

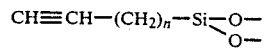

is formed by reaction on the surface of the substrate 21 by using a silane surface active agent, such as CH≡CH—(CH$_2$)$_n$— SiCl$_3$ (where n is an integer, preferably 10 to 20), by the chemical adsorption technique. Dipping in, for instance, a solution of 80% n-hexane, 12% carbon tetrachloride, and 8% chloroform dissolved at a concentration of $2.0 \times 10^{-3}$ to $5.0 \times 10^{-2}$ mol/liter, a bonding 23 of

Figure 3A:
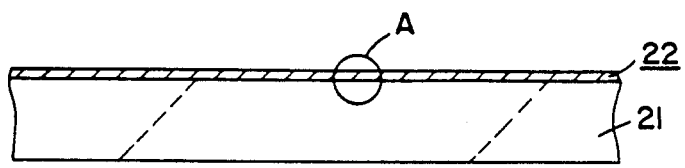
FIG. 3 shows process sectional view of the second embodiment for explaining the method of the invention, in which a, c are the sectional view of substrate to conceptually explain the process, and b, d, e are magnified views of a, c at the molecular level in the parts A, B.
Figure 3B:
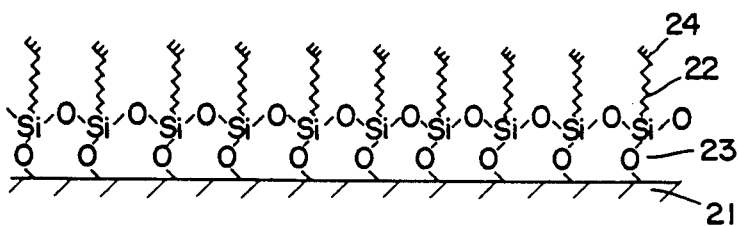

is formed on the SiO$_2$ surface (FIG. 3a). Here, in order to stabilize the acetylene group at the terminal end of the molecule, the chemical adsorption may be carried out by using Me$_3$Si—C≡C—(CH$_2$)$_n$—SiCl$_3$ as a silane surface active agent, in this case, when dipped in 10% KOH aqueous solution after adsorption, the —SiMe$_3$ group is dissociated, and the monomolecular film 22 of

Figure 3C:
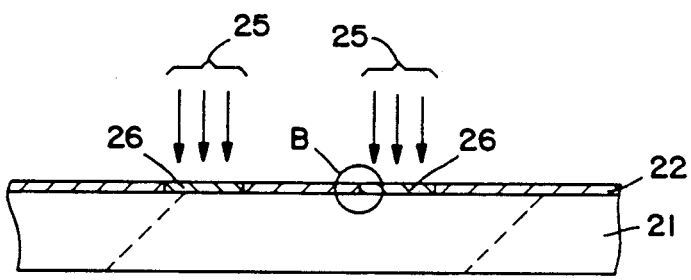
Figure 3D:
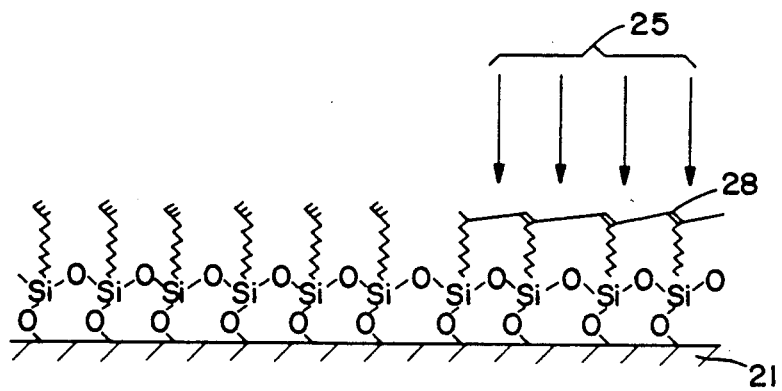

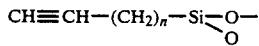

can be similarly formed. Now the acetylene groups 24 of the silane surface active agent are arranged on the substrate surface (FIG. 3b), and polymerization reaction occurs between the surrounding acetylene groups, when an electron beam 25 is exposed patternwise as shown in FIG. 3c. As a result, as shown in FIG. 3d, the triple bonds of acetylene groups 24 were changed to polyacetylene bonds 28 in the portion 26 irradiated with electron beams and are thus selectively deactivated.

Figure 3E:
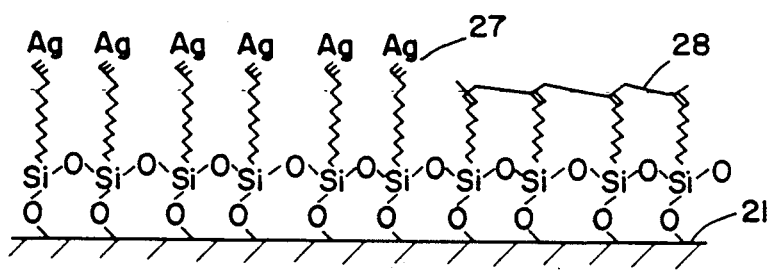

In the next step, the substrate is dipped in an aqueous solution of a chemical substance containing metal, for example silver nitrate (AgNO$_3$) or copper ammonium hydroxide [Cu(NH$_3$)$_2$OH]. In consequence, by reaction between the acetylene groups 24 and AgNO$_3$ on the surface of the monomolecular film 22, Ag 27 (or Cu) is selectively formed on the monomolecular film 22 (FIG. 3e).

In this method, an atomic or molecular metal thin film can be selectively formed on a sub-micron or ultrafine monomolecular responsive thin film. Therefore, by the method of this embodiment, ultrafine wire can be formed, which is greatly effective for fabrication of electronic devices such as semiconductor devices. As this time, when it is desired to form a metal thin film on the entire surface of the substrate, as is evidently known, the electron beam irradiation step may be omitted.

In the foregoing embodiment, the method of adsorption reaction of the silicone surface active agent is presented in relation to the responsive thin film, but it is also possible to prepare a responsive thin film by the Langmuir-Blodgett technique by using a reagent having its —Cl preliminarily replaced with the —OH group (CH≡CH—(CH$_2$)$_n$—Si(OH)$_3$, etc.).

The method of this invention may be also applied as the manufacturing technique of molecular devices by using diacetylene group (—C≡C—C≡CH) instead of the acetylene group in the molecule of the silane surface active agent shown in the above embodiment, or by using a reagent containing a molecule for forming a π conjugate polymer or functional molecule such as —C≡C—C≡C—, —C$_6$H$_4$—C$_4$NH$_4$—, —C$_4$SH$_2$—, —C$_6$H$_4$—CH=CH—, —C$_6$H$_4$—S—, —C$_6$H$_4$—O—, between the CH$_2$ bondings in the straight chain or as a side chain.

Thus, according to the method of the invention, since the energy beam responsive thin film, on which pattern is formed, is a single layer or several layers of monomolecular film, it is possible to form ultrafine metal patterns. Furthermore, by performing the selective film growth reaction by the reaction between —SiCl$_3$ and —OH group, between —C≡CH group and Ag or Cu ion, a highly conductive pattern can be obtained. Therefore, the method of this invention brings about a great benefit in preparing ultrafine wiring pattern, in particular, in forming wiring in VLSI fabrication.

Since the Langmuir-Blodgett technique or absorption reaction technique used in preparing of a responsive film undergoes interface reaction on the substrate surface, the process is less affected by steps on the substrate and it is very useful on a substrate having many steps such as VLSI devices.

This embodiment relates to an example of interface reaction between —SiCl$_3$ and —OH, and between Ag or Cu ion and —C≡CH, but this is not limitative as far as the substrate has a similar reaction mechanism. The method of the invention is hence particularly effective for formation of ultrafine wiring pattern, especially, for improvement in the wiring process in VLSI production.

We claim:

1. A method for producing an ultrathin metal film which comprises:
   a. depositing a monomolecular thin film having reactive groups capable of reacting with a metal salt to form a metal, on a substrate,
   b. contacting the surface of said monomolecular thin film with a solution of said metal salt, whereby an ultrathin metal film is deposited on the surface of said thin film.

2. Method for producing an ultrathin metal film according to claim 1, wherein said monomolecular thin film is formed from a chlorosilyl-type surfactant, having a chlorosilyl group at one end of the surfactant molecule, and the film is applied to said substrate by a chemical adsorption technique.

3. The method for producing an ultrathin metal film according to claim 2 wherein said substrate is SiO$_2$, said chlorosilyl-type surfactant is CH$_2$=CH—(CH$_2$)$_n$—SiCl$_3$ wherein n is an integer of from about 10 to 20, said chlorosilyl-type surfactant is reacted with said SiO$_2$ substrate to form

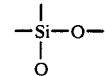

bonds on the SiO$_2$ surface, said vinyl groups from said chlorosilyl-type surfactant are selectively polymerized by electron beam irradiation, whereby the double bonds of the selectively irradiated vinyl groups are deactivated, the unirradiated portion is reacted with a solution of diborane, whereby hydroxyl groups are formed on the vinyl group of said unirradiated portion, the hydroxyl groups are converted to aldehyde groups, and said aldehyde groups are reacted with a metal salt, whereby said ultrathin metal film is formed.

4. The method for producing an ultrathin metal film according to claim 1 wherein the monomolecular thin film is deposited on the substrate by the Langmuir-Blodgett technique or a chemical adsorption technique.

5. A method for pattern formation which comprises:
 a. depositing an energy beam responsive monomolecular thin film on a substrate,
    said film having groups on the surface thereof, which when exposed to an energy beam, form groups which are capable of reacting with a metal salt to form a metal or
    said film having groups on the surface thereof which react with a metal salt to form a metal and which when exposed to an energy beam, become incapable of reacting with a metal salt to form a metal,
 b. exposing said groups on said monomolecular thin film to an energy beam in a patternwise manner, whereby they selectively become capable or incapable of reaction with a metal salt in the exposed areas and
 c. contacting said exposed thin film of b. with a metal salt solution whereby metal is deposited on the portions on said thin film which still contain groups capable of reacting with said metal salt, and whereby a pattern is formed.

6. The method for pattern formation according to claim 5 wherein the monomolecular thin film is formed by the Langmuir-Blodgett technique or chemical adsorption technique.

7. The method for pattern formation according to claim 5 wherein a vinyl group or acetylene group is the group which is rendered capable or incapable of reacting with a metal salt to form a metal by exposure to an energy beam.

8. An ultrathin metal film having an atomic or molecular metal deposited on a monomolecular thin film containing acetylenic groups, by selective chemical reaction between a metal salt and said acetylenic group.

9. The ultrathin metal film according to claim 8, wherein the metal salt comprises silver or copper and wherein silicone is included in the monomolecular thin film.

10. A method for producing an ultrathin metal film which comprises:
 a. depositing a monomolecular thin film having an acetylenic group thereon on a substrate, said acetylenic group being capable of reacting with a metal salt to form a metal, and
 b. reacting a solution of said metal salt and said acetylenic group on the thin film surface to form an acetylenic-metal bond.

11. A method for producing an ultrathin metal film according to claim 10 wherein the acetylenic group reacting with the metal salt is a diacetylene group and the metal salt comprises silver or copper.

12. The method for producing an ultrathin metal film according to claim 10 wherein the monomolecular thin film is deposited by the Langmuir-Blodgett technique or chemical adsorption technique, whereby the acetylene groups are formed on the surface of the substrate.

13. A method for pattern formation which comprises:
 a. depositing an energy beam responsive monomolecular thin film on a substrate,
 b. said film having acetylenic groups on the surface thereof, which when exposed to an energy beam, form groups which are capable of reacting with a metal salt to form a metal,
 c. exposing said acetylenic groups on said monomolecular thin film to an energy beam in a patternwise manner, whereby they become selectively incapable of reacting with a metal salt in the exposed areas and
 d. contacting said exposed thin film of b. with a metal salt solution, whereby metal is deposited on the portions of said thin film which contain acetylenic groups, through acetylenic-metal bonds.

14. The method for pattern formation according to claim 13 wherein the monomolecular thin film is deposited on the substrate by the Langmuir-Blodgett technique or chemical adsorption technique, so that the acetylenic groups are formed on the surface of the substrate.

15. A method for pattern formation which comprises:
 a. depositing an energy beam responsive monomolecular thin film on a substrate,
 b. said film having diacetylenic groups on the surface thereof, which when exposed to an energy beam, form groups which are capable of reacting with a metal salt to form a metal.
 c. exposing said diacetylenic groups on said monomolecular thin film to an energy beam in a patternwise manner, whereby they become selectively incapable of reacting with a metal salt in the exposed areas and
 d. contacting said exposed thin film of b. with a metal salt solution, whereby metal is deposited on the portions of said thin film which contain diacetylenic groups, through diacetylenic-metal bonds.

* * * * *